United States Patent

[11] 3,582,812

[72] Inventor Kiyoshi Kochi
Tokyo, Japan
[21] Appl. No. 792,439
[22] Filed Jan. 21, 1969
[45] Patented June 1, 1971
[73] Assignee Iwatsu Electric Company Limited
Tokyo, Japan
[32] Priority Jan. 22, 1968, Jan. 22, 1968
[33] Japan
[31] 3248-68 and 3249-68

[54] FREQUENCY DIVIDING AND MULTIPLYING CIRCUITS USING A SAMPLING TECHNIQUE

5 Claims, 4 Drawing Figs.

[52] U.S. Cl. .......... 331/25, 324/85, 328/16, 328/25, 328/151
[51] Int. Cl. .......... H03b 3/04, H03b 19/00
[50] Field of Search .......... 331/14, 18, 25; 328/151, 15, 16, 25; 321/60, 61; 324/85

[56] References Cited
UNITED STATES PATENTS

| | | | |
|---|---|---|---|
| 3,217,267 | 11/1965 | Loposer .......... | 331/18X |
| 3,271,666 | 9/1966 | Anderson et al. .......... | 324/57 |

*Primary Examiner*—John Kominski
*Assistant Examiner*—Siegfried H. Grimm
*Attorney*—Chittick, Pfund, Birch, Samuels and Gauthier

ABSTRACT: In a frequency division circuit a sampling pulse occurring at a period of $$\frac{1}{\frac{f}{n}\left(\frac{M+1}{M}\right)}$$

is formed from an input signal of frequency $f$, the sampling pulse is used to effect sampling of the input signal to provide an output signal having a reduced frequency and a waveform similar to that of the input signal. To effect frequency step-up a signal of the reduced frequency produced by the frequency division circuit is compared with a stable reference frequency in a comparator to provide a control signal which is used to control a controlled oscillator such that the reduced frequency and the reference frequency coincide each other.

KIYOSHI KOCHI INVENTOR

BY
Chittick, Pfund, Birch, Samuels & Gauthier
ATTORNEY

KIYOSHI KOCHI INVENTOR

BY Christlieb, Pfund, Birch, Samuels & Gauthier

ATTORNEY

FREQUENCY DIVIDING AND MULTIPLYING CIRCUITS USING A SAMPLING TECHNIQUE

BACKGROUND OF THE INVENTION

This invention relates to a frequency converting system and more particularly to a system of stepping-up or stepping-down a frequency of an input signal at a definite ratio.

Although many types of frequency converting systems have been proposed in the past to step-up or stepdown a given frequency it has been difficult to maintain a constant ratio of frequency conversion over a wide range of frequencies of the input signal and to derive output signals having a waveform similar to that of input signals. In the transfer oscillator method utilized to stepdown frequencies it is necessary to vary the gating time corresponding to the orders of higher harmonics. Furthermore, in the frequency step-up system it has been difficult to provide outputs of stable frequencies in high frequency ranges.

SUMMARY OF THE INVENTION

It is therefore an object of this invention to provide a novel frequency stepdown system which can maintain constant ratio of frequency division over a wide range of frequency of the input signal and can provide an output signal having a waveform similar to that of the input signal.

Another object of this invention is to provide a novel frequency step-up system which can maintain constant ratio of frequency multiplication and can provide an output signal having a stable frequency over a wide frequency range.

Briefly stated, according to one embodiment of this invention there is provided a frequency converting system comprising a synchronous frequency division circuit to step down the frequency $f$ of an input signal to $f/n$, a frequency division circuit to further stepdown said frequency $f/n$ to $f/Mn$, a frequency synthesizing circuit to provide a sum of frequencies $f/n$ and $f/Mn$, a pulse forming circuit for converting the output signal from the frequency synthesizing circuit into a sampling pulse having a period equal to that of said output signal and a signal deriving circuit to sample said input signal in accordance with said sampling pulse.

In a modified embodiment of this invention, a controlled oscillator is provided to produce an output having an output frequency $f=MFs$ and the frequency converting system of the first embodiment is used to stepdown said output frequency to a reduced frequency $f/M$ and a comparator is provided to compare said reduced frequency $f/M$ with a stable reference frequency $Fs$ from a reference oscillator to produce a control signal which is used to control the controlled oscillator such that said reduced frequency and said reference frequency will coincide.

In this manner, it is possible to produce an output of a reduced frequency having a waveform similar to that of the input signal. In the case of frequency multiplication it is possible to produce a high frequency output having a stable frequency over a wide frequency range.

BRIEF DESCRIPTION OF THE DRAWING

This invention can be more fully understood from the following detailed description when taken in conjunction with the accompanying drawing, in which.

DESCRIPTION OF THE PREFERRED EMBODIMENTS

Figure 1:
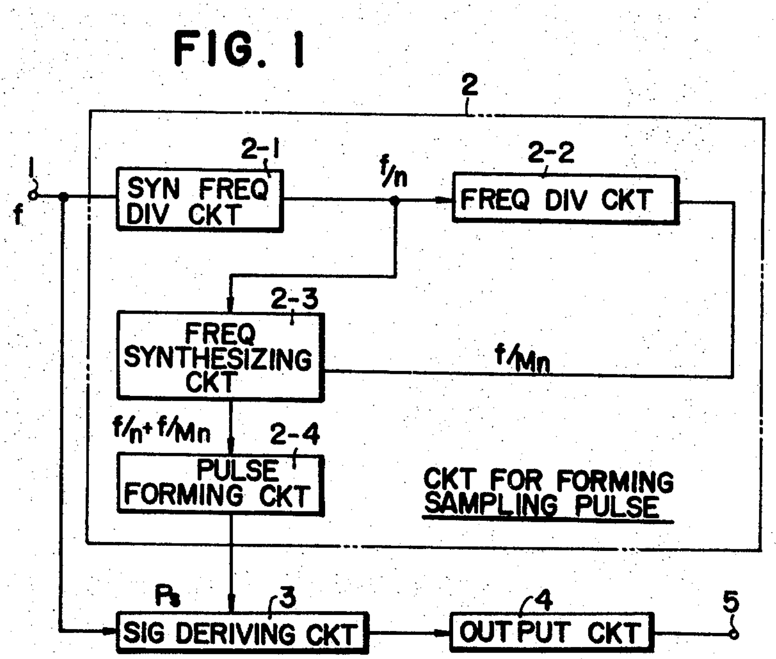
FIG. 1 is a block diagram of a frequency stepdown system constructed according to this invention.

Referring now to FIG. 1 of the accompanying drawing reference numeral 1 designates an input terminal, 2 a sampling pulse forming circuit adapted to form a sampling pulse to sample an input signal supplied to input terminal 1 in a signal deriving circuit 3, 4 an output circuit to convert a signal sampled in the signal deriving circuit 3 into an output signal having a desired waveform such as a sine wave, and 5 an output terminal. The sampling pulse forming circuit 2 comprises a synchronous frequency division circuit 2–1, a frequency division circuit 2–2, a frequency synthesizing circuit 2–3 and a pulse forming circuit 2–4. The synchronous frequency division circuit 2–1 comprises a self-excitation type oscillator which oscillates at a frequency sufficiently lower than the frequency of the input signal and can synchronize with high frequencies from several to several tens times of this frequency. This circuit is constructed such that it can vary its ratio of frequency division by adjusting the control voltage (for example the bias voltage of its oscillation element) for the oscillator. The output frequency of this circuit is expressed by $f/n$, where $f$ represents the frequency of the input signal and $n$ a ratio of frequency division. The frequency division circuit 2–2 functions to divide or stepdown the output frequency $f/n$ of the synchronous frequency division circuit 2–1 at a definite integer ratio. Thus, the output frequency is represented by $f/Mn$, where $M$ represents the ratio of frequency division. The frequency synthesizing circuit 2–3 functions to provide a frequency corresponding to the sum of the output frequency $f/n$ from the synchronous frequency division circuit 2–1 and the output frequency $f/Mn$ of the frequency division circuit 2–2. Thus, the output frequency from the frequency synthesizing circuit can be expressed by $$\frac{f}{n}+\frac{f}{Mn}=\frac{f}{n}\left(\frac{M+1}{M}\right).$$

The pulse forming circuit 2–4 functions to convert the output signal having a frequency $$\frac{f}{n}\left(\frac{M+1}{M}\right)$$

from the frequency synthesizing circuit 2–3 into a sampling pulse $Ps$ having the same period as said output from frequency synthesizing circuit 2–3. In other words, when the frequency of the sampling pulse $Ps$ is denoted by $Fp$ $$\left(\text{or } \frac{f}{n}\left(\frac{M+1}{M}\right)\right),$$

the period of the sampling pulse will be represented by $1/Fp$.

Figure 3:
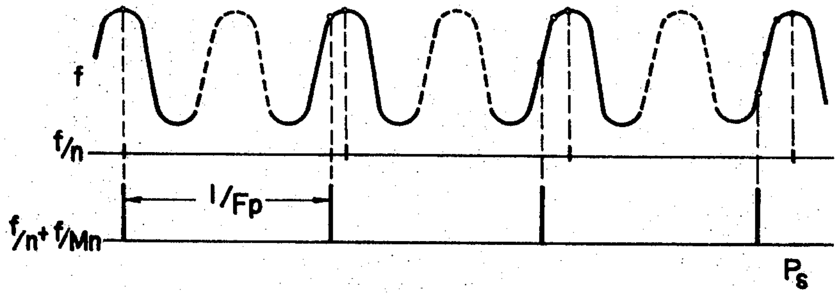
FIGS. 3 and 4 show waveforms to explain the operation of this invention.
Figure 4:
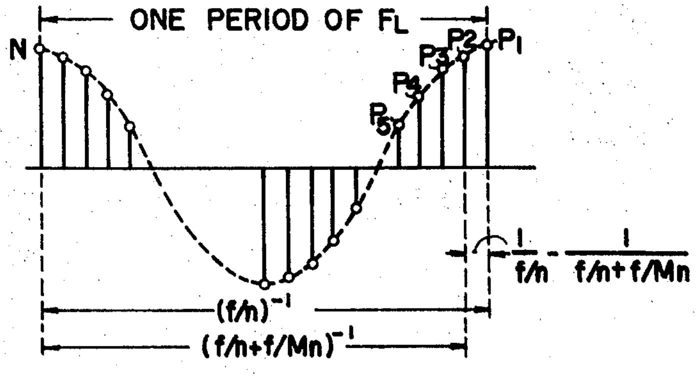

Considering now an envelope signal (having a period $1/F_1$) of a signal obtained by sampling an input signal of a frequency $f$ in the signal deriving circuit 3 by utilizing a sampling pulse $Ps$ having a frequency of $Fp$ in a manner as shown in FIG. 3, the relationship among the number $N$ of the sampling pulse $Ps$ required for forming one period of this envelope signal, the period $(1/Fp)$, the output frequency $f/n$ of the synchronous frequency division circuit 2–1 and the frequency $f$ of the input signal is represented by the following equation and shown in FIG. 4.

$$N=\frac{\frac{1}{f}}{\frac{1}{\frac{1}{f}}-\frac{1}{\frac{f}{n}\left(\frac{M+1}{M}\right)}}=\frac{M+1}{n} \quad (1)$$

Since one period $1/F_1$ of the envelope signal can be represented by the product of the period $1/Fp$ of the sampling pulse and the number $N$ of the sampling pulse $Ps$, the following equation holds true.

$$\frac{1}{F_1}=\frac{1}{\frac{f}{n}\left(\frac{M+1}{M}\right)}\times N=\frac{Mn}{(M+1)f}\cdot\frac{M+1}{n}=\frac{M}{f} \quad (2)$$

This shows that the frequency $(F_1)$ of the envelope signal of the sampled signal equals the input signal frequency divided by $M$.

Denoting the ratio of frequency division $M$ as $10^i$, for example, 10, 100 and 1000, it will be seen that this invention enables to stepdown the frequency of the input signal to $1/10^i$ and hence it is able to measure high frequencies at a resolution of 10'Hz. such as 10Hz., 100Hz. and 1kHz. where use is made of a conventional counter of 1 second gate.

Thus, in accordance with the illustrated embodiment of this invention, it is able to stepdown an input signal frequency at a definite ratio of frequency division to provide an output signal having a waveform similar to that of the input signal by selecting a suitable ratio of frequency division of the synchronous frequency division circuit 2–1 so that the frequency division circuit 2–2 may always maintain a ratio of frequency division $M$. For this reason, the frequency division circuit is especially suitable for use in the measurement of frequency, observation of waveform and the like applications.

Figure 2:
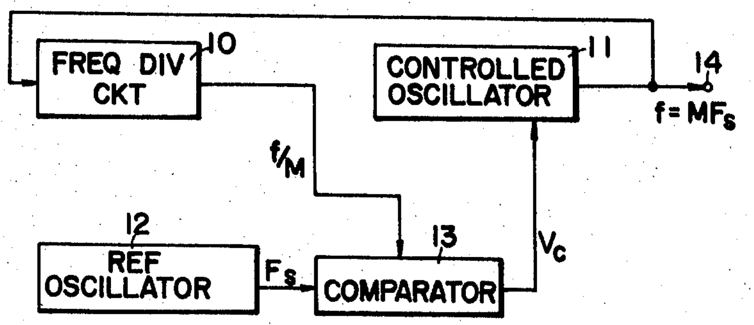
FIG. 2 is a block diagram of a frequency step-up system utilizing the frequency stepdown system shown in FIG.1.

FIG. 2 shows a block diagram of a modified embodiment of this invention adapted to step-up or multiply a frequency by utilizing the frequency division circuit shown in FIG. 1. In the modification shown in FIG. 2 there is provided a controlled oscillator 11 controlled by a control signal $Vc$ to provide an output signal having a desired frequency $f$. Frequency division circuit 10 has the same construction as the circuit shown in FIG. 1 and functions to convert frequency $f$ into a frequency $f/M$. There is also provided a reference oscillator 12 to generate a stable reference frequency $Fs$ which is supplied to a comparator 13. The output frequency $f/M$ of the frequency division circuit 10 and the frequency $Fs$ of the reference oscillator 12 are compared by comparator 13 to provide control signal $Vc$ having a magnitude proportional to the difference between frequencies $f/M$ and $Fs$ and a polarity dependent upon the relative magnitude thereof. The control voltage $Vc$ is coupled to controlled oscillator 11 to control it such that the control voltage $Vc$ thereof will be minimum.

With this arrangement, the frequency $f$ of the output signal from the controlled oscillator becomes equal to $M$ times of the stable output frequency $Fs$ of the reference oscillator 12. As has been already pointed out since it is very easy to make $M$ to be equal to 100, 1000 or more it is possible to derive output signals of stable frequency.

Thus, according to this modification a sampling pulse is produced at a period of $$\frac{1}{\frac{1}{f}\left(\frac{M+1}{M}\right)}$$

($n$ and $M$ are integers, respectively) from an output signal of frequency $i$ from a controlled oscillator, the sampling pulse is utilized to sample said output signal to produce a signal having a reduced frequency of $1/M$ of the frequency $f$ of said output signal, and the frequency of the controlled oscillator is controlled such that the reduced frequency and the output frequency of a reference oscillator coincide whereby a stepped-up frequency equal to $M$ times the output frequency of the reference oscillator can be derived from the controlled oscillator. As mentioned above, since it is easy to make $M$ to be equal to a large number such as 100 or 1000 or more it is possible to select the output frequency $Fs$ of the reference oscillator in a stable low frequency range and yet provide stable high frequencies.

While the invention has been shown and described in terms of its preferred embodiments it should be understood that this invention is by no means limited to these particular embodiments and that many changes and modifications may be made without departing from the true spirit and scope of the invention as defined in the appended claims.

What I claim is:

1. A frequency converting system comprising first frequency division circuit means for dividing by $n$ the frequency $f$ of an input signal to produce a first submultiple frequency $f/n$, second frequency division circuit means for dividing by $M$ said submultiple frequency $f/n$ to produce a second submultiple frequency $f/Mn$, frequency synthesizing circuit means responsive to said first and second submultiple frequencies for providing a sum output signal frequency equal to $f/n + f/Mn$, pulse forming circuit means for converting said output signal from said frequency synthesizing circuit means into a sampling pulse having a period equal to that of said output signal, and signal deriving circuit means for sampling said input signal in accordance with said sampling pulse.

2. A frequency converting system comprising a frequency controlled oscillator having an output frequency $f$, means responsive to said output frequency for producing a sampling pulse occurring at a period of $$\frac{1}{\frac{f}{n}\left(\frac{M+1}{M}\right)}$$

where $n$ and $M$ are integers, means for utilizing said sampling pulse to effect sampling of said output signal to provide a reduced frequency signal of a frequency of $1/M$ of that of said output signal, a reference oscillator, means for comparing the frequencies of said reduced frequency signal and the output of said reference oscillator to produce a control signal, and means for applying said control signal to control the frequency of said controlled oscillator to make said output signal have a frequency of $M$ times of the output frequency of said reference oscillator.

3. A frequency converting system comprising:

a controlled oscillator for generating an output having a frequency $f=MFs$;

a frequency division means including first frequency division circuit means for dividing the frequency $f$ of the output from said controlled oscillator to $f/n$, second frequency division circuit means for dividing said frequency $f/n$ to $F/Mn$, frequency synthesizing circuit means responsive to said first and second frequency division circuit means for producing the sum of said frequencies $f/n+F/Mn$, a pulse forming circuit means for converting the output signal from said frequency synthesizing circuit means into a sampling pulse having a period equal to $(f/n+f/Mn)^{11}$ and signal deriving circuit means for extracting a frequency $f/M$ from said sampling pulse and said frequency $f$;

a reference oscillator for generating a stable reference frequency $Fs$;

comparator means for comparing said output frequency $f/M$ from said frequency division means with the output frequency $Fs$ from said reference oscillator to provide a control signal; ; and means for controlling said controlled oscillator with said control signal such that said control signal will be minimum thereby maintaining the output frequency $F=MFs$.

4. A frequency converting system for sampling an input signal of frequency $f$ to produce an output signal of frequency $f/M$ comprising:

means responsive to said input signal for deriving a sampling pulse signal occurring at a period of $$\frac{1}{\frac{f}{n}\left(\frac{M+1}{M}\right)}$$

where $n$ and $M$ are integers;

means for sampling said input signal with said pulse signal; and means for periodically converting $M+1/n$ sampled portions of said input signal into said output signal of frequency $f/M$.

5. A frequency divider for a source signal of frequency $f$ comprising:

first frequency division circuit means for dividing by $n$ said source signal of frequency $f$ to obtain a first output of frequency $f/n$;

second frequency division circuit means for dividing by $M$ said first output to obtain a second output of frequency $f/nM$;

frequency synthesizing circuit means responsive to said first and second outputs for producing a sum signal of frequency $f/n + f/nM$; and means responsive to said source signal and said sum signal for producing an output signal of frequency $f/M$.

PO-1050
(5/69)

UNITED STATES PATENT OFFICE
CERTIFICATE OF CORRECTION

Patent No. 3,582,812 Dated June 1, 1971

Inventor(s) Kiyoshi Kochi

It is certified that error appears in the above-identified patent and that said Letters Patent are hereby corrected as shown below:

Column 3, line 46, the letter "i" should be -- f --.

Column 4, line 36, "$(f/n+f/Mn)^{11}$" should be

-- $(f/n+f/Mn)^{-1}$ --.

Signed and sealed this 12th day of October 1971.

(SEAL)
Attest:

EDWARD M.FLETCHER,JR.
Attesting Officer

ROBERT GOTTSCHALK
Acting Commissioner of Patents

UNITED STATES PATENT OFFICE
CERTIFICATE OF CORRECTION

Patent No. 3,582,812 Dated June 1, 1971

Inventor(s) KIYOSHI KOCHI

It is certified that error appears in the above-identified patent and that said Letters Patent are hereby corrected as shown below:

Column 2, equation (1), $$" N = \frac{\frac{1}{f}}{\frac{1}{\frac{1}{f}} - \frac{1}{\frac{f}{n}\left(\frac{M+1}{M}\right)}} = \frac{M+1}{n} "$$

should be $$-- N = \frac{\frac{1}{f}}{\frac{1}{\frac{f}{n}} - \frac{1}{\frac{f}{n}\left(\frac{M+1}{M}\right)}} = \frac{M+1}{n} --$$

Signed and sealed this 23rd day of July 1974.

(SEAL)
Attest:

McCOY M. GIBSON, JR.
Attesting Officer

C. MARSHALL DANN
Commissioner of Patents